United States Patent
Boonstra

(10) Patent No.: US 8,896,971 B2
(45) Date of Patent: Nov. 25, 2014

(54) ALIGNED MAGNETIC INSULATING FEATURE

(75) Inventor: Thomas Roy Boonstra, Chaska, MN (US)

(73) Assignee: Seagate Technology LLC, Cupertino, CA (US)

( * ) Notice: Subject to any disclaimer, the term of this patent is extended or adjusted under 35 U.S.C. 154(b) by 45 days.

(21) Appl. No.: 13/590,935

(22) Filed: Aug. 21, 2012

(65) Prior Publication Data
US 2014/0057133 A1 Feb. 27, 2014

(51) Int. Cl.
*G11B 5/39* (2006.01)

(52) U.S. Cl.
USPC .............. 360/320; 360/319; 360/324.2

(58) Field of Classification Search
CPC ................. G11B 5/39; G11B 5/3993
USPC ................ 360/313–328
See application file for complete search history.

(56) References Cited

U.S. PATENT DOCUMENTS

| | | | |
|---|---|---|---|
| 5,187,628 A | 2/1993 | Kanai et al. | |
| 5,576,914 A | 11/1996 | Rottmayer et al. | |
| 5,696,656 A | 12/1997 | Gill et al. | |
| 6,721,139 B2 | 4/2004 | Gill | |
| 6,724,584 B2 | 4/2004 | Mack et al. | |
| 7,035,062 B1 | 4/2006 | Mao et al. | |
| 7,382,589 B2 | 6/2008 | Lin et al. | |
| 7,436,637 B2 | 10/2008 | Pinarbasi | |
| 7,570,461 B2 | 8/2009 | Sapozhnikov | |
| 7,899,166 B1 | 3/2011 | Ravindranath et al. | |
| 2003/0228488 A1* | 12/2003 | Covington et al. | 428/692 |
| 2009/0034132 A1* | 2/2009 | Miyauchi et al. | 360/324 |
| 2009/0059442 A1* | 3/2009 | Mizuno et al. | 360/324 |
| 2009/0061258 A1* | 3/2009 | Mizuno et al. | 428/811.3 |
| 2009/0109580 A1* | 4/2009 | Ayukawa et al. | 360/324.12 |
| 2009/0128965 A1* | 5/2009 | Mizuno et al. | 360/324 |
| 2009/0237839 A1* | 9/2009 | Hirata et al. | 360/314 |
| 2010/0165510 A1 | 7/2010 | Takahashi et al. | |
| 2011/0228428 A1* | 9/2011 | Dimitrov et al. | 360/320 |
| 2012/0134057 A1* | 5/2012 | Song et al. | 360/319 |
| 2012/0268846 A1* | 10/2012 | Gadbois et al. | 360/319 |
| 2012/0268847 A1* | 10/2012 | Dimitrov et al. | 360/320 |
| 2013/0065084 A1* | 3/2013 | Dimitrov et al. | 428/810 |
| 2013/0069642 A1* | 3/2013 | Sapozhnikov et al. | 324/260 |
| 2014/0004386 A1* | 1/2014 | Covington et al. | 428/816 |

* cited by examiner

*Primary Examiner* — Craig A. Renner
(74) *Attorney, Agent, or Firm* — Hall Estill Attorneys at Law

(57) ABSTRACT

Various apparatus and associated method embodiments are generally directed to a magnetic stack positioned on an air bearing surface (ABS) and biased to a predetermined magnetization by a bias magnet. The bias magnet can be separated from the magnetic stack and at least one magnetic shield by a self-aligned magnetic insulating feature that is comprised of first and second insulating layers.

18 Claims, 4 Drawing Sheets

US 8,896,971 B2

ALIGNED MAGNETIC INSULATING FEATURE

SUMMARY

Various embodiments can be directed towards a magnetic stack positioned on an air bearing surface (ABS) and biased to a predetermined magnetization by a bias magnet. The bias magnet can be separated from the magnetic stack and at least one magnetic shield by a self-aligned magnetic insulating feature that is comprised of first and second insulating layers.

DETAILED DESCRIPTION

With data storage devices diligently developing towards larger data capacity and faster data transfer rates, the form factors of various data storage components, such as magnetic shields and magnetically responsive stacks, decrease. The smaller data storage components can correspond to data reading and writing elements that are susceptible to process variations such as layer thickness, clearance, and alignment that degrade performance of a data storage device. The use of magnetic shields with varying thickness can provide greater usable shield-to-shield area without increasing the overall shield-to-shield spacing.

While the availability of greater area between shields can be utilized to provide greater magnetic response to external data bits, the fabrication of a magnetic element with varying thickness shields can prove difficult with conventional deposition techniques. For example, alignment of the portions of the magnetic shields with varying thickness between top and bottom shields can be plagued by the slightest of variation in the previous construction of the various layers of the magnetic element. As such, construction of reduced form factor magnetic elements with features capable of self-alignment with other portions of the magnetic element is in increasing demand in the industry.

Accordingly, a magnetically responsive stack can be positioned on an air bearing surface and biased to a predetermined magnetization by a bias magnet. The bias magnet may be separated from the magnetic stack and at least one magnetic shield by a self-aligned magnetic insulating feature that is comprised of first and second insulating layers. The fabrication of the magnetic insulating feature with the first and second insulating layers allows for self-alignment of the varying thickness portions of the top and bottom magnetic shields, which compensates for process variations while increasing magnetic element performance.

Throughout the following disclosure, the term "self-aligned" will be used. While the term is not limited to a particular definition, it will be understood herein to mean deposition will establish alignment between an edge of the magnetic stack and the transition portion of the magnetic shield. That is, a feature can be self-aligned by being deposited and providing alignment of the varying thickness portion of the magnetic shield with the magnetic stack. Such alignment may or may not be achieved with subsequent processing, such as etching, and may correspond with alignment of a transition portion of a different magnetic shield, but such is not required.

Figure 1:
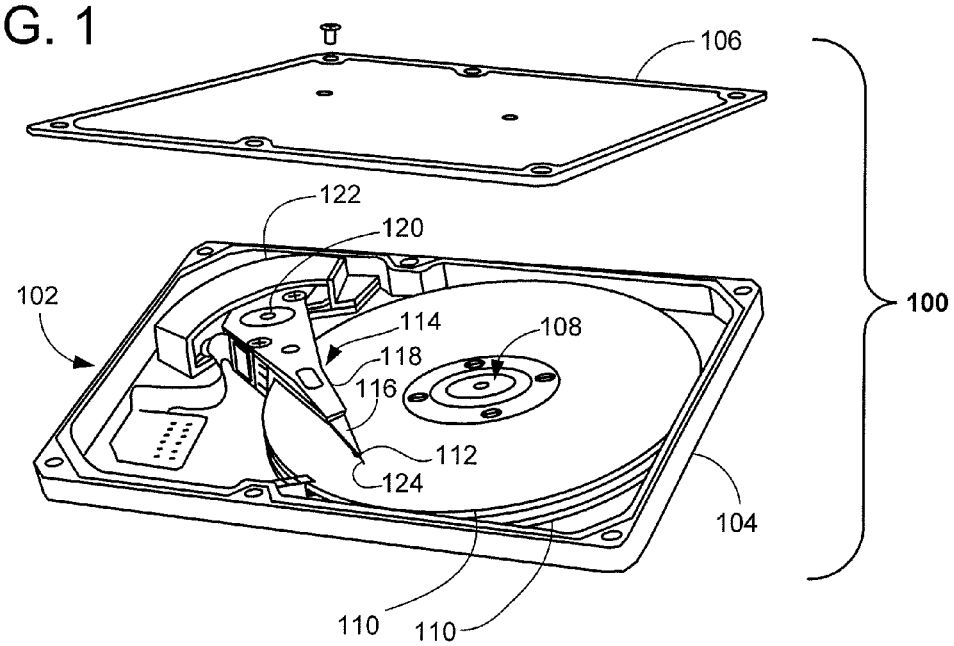
FIG. 1 is a perspective view of an example data storage device.

As an example of the type of environment a self-aligned feature could be utilized, FIG. 1 provides a perspective view of a data storage device 100. The device 100 shows a non-limiting environment in which various embodiments of the present technology can be practiced. The device 100 includes a substantially sealed housing 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers (numerically denoted at 124) to align with tracks (not shown) defined on the media surfaces to store data thereto or retrieve data therefrom.

Figure 2:
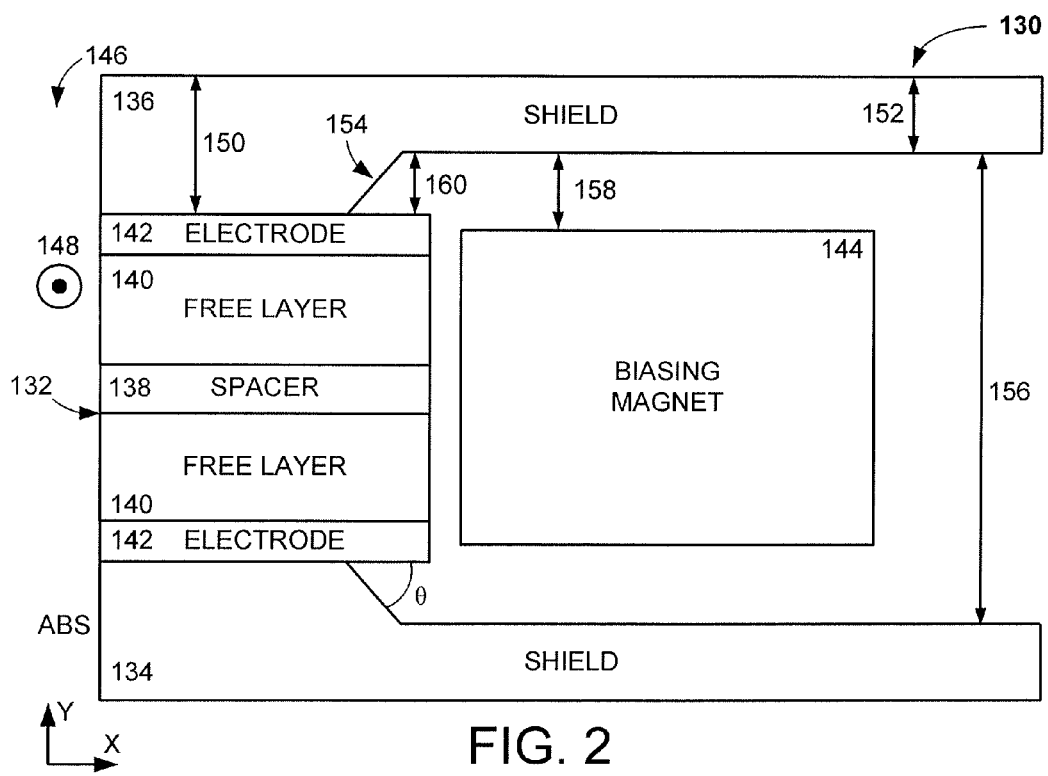
FIG. 2 shows a cross-section block representation of a magnetic element capable of being used in the data storage device of FIG. 1.

FIG. 2 generally illustrates a cross-section block representation of an example magnetic element 130 capable of being used in the data storage device 100 of FIG. 1. The element 130 can be constructed, as shown, with a magnetic sensing stack 132 disposed between first and second magnetic shields 134 and 136. Construction of the magnetic stack 132 is unlimited and can be a lamination of any number of layers with any magnetic orientation that is magnetically responsive. One such construction has a non-magnetic spacer layer 138 disposed between dual magnetically free layers 140 that are each attached to electrodes 142, which can be a variety of different orientations and materials, such as cap and seed layers.

With the presence of magnetically free layers 140 without a fixed magnetization in the magnetic stack 132 that can be used as a reference, a permanent magnet 144 is positioned adjacent the stack 132 opposite from the stack portion that contacts an air bearing surface (ABS) 146 to impart a magnetic bias magnetic force on the free layers 140 without affecting the operational characteristics of the ABS side of the stack 132. That is, the free layers 140 are biased by the high magnetic coercivity biasing magnet 144 to a default magnetization that allows accurate sensing of data bits across the ABS 146.

The magnetic element 130 can operate to sense data bits passing within the shield-to-shield spacing (SSS) of the element 130 and within a predetermined track width 148 while blocking distal data bits generated from outside of the track with the magnetic shields 134 and 136. Thus, the operation of the magnetic shields 134 and 136 allows the magnetic stack 132 to sense only the magnetic fields within the SSS and predetermined track 138, which is particularly pertinent with the increasing demand for high density data storage devices. However, with decreasing form factors that reduce the size of data track widths 148 while increasing data bit density, the space between the shields 134 and 136 may be insufficient to construct a biasing magnet 144 that can properly bias the free layers 140 to a default magnetization.

As shown, the magnetic shields 134 and 136 can be respectively configured to have varying thicknesses 150 and 152 proximal and distal to the ABS 146 connected by a transition region 154. The transition region 154 can be shaped in a number of different configurations, such as curvilinear, stepped, and beveled at a predetermined angle θ, that defines the reduction of shield thickness and increase in shield-to-shield spacing 156 distal the ABS 146. With the transition region 154 configuration, the magnetic shield 136 can be precisely oriented with any number of thickness variations that provide separation gaps 158 and 160 respectively between the shield 136 and the biasing magnet 144 and magnetic stack 132, which can provide performance improvements that maintains strict shielding characteristics at the ABS and reduces magnetic shunting while allowing efficient interaction between the magnetic stack 132 and biasing magnet 144.

While the design and operation of the magnetic element 130 can be straightforward, fabrication of the various layers, materials, and intricate aspects, such as the transition region, may become difficult in reduced form factor data storage devices. It can be appreciated that the construction of the magnetic element 130 can involve a wide variety of processing steps that can each introduce variance in the thickness, position, and shape of the various layers. The inclusion of the varying thickness shields 134 and 136 can further add complexity to the fabrication of the magnetic element 130 by introducing the alignment of the transition regions 154 of the top and bottom shields 134 and 136 along the X axis.

Figure 3:
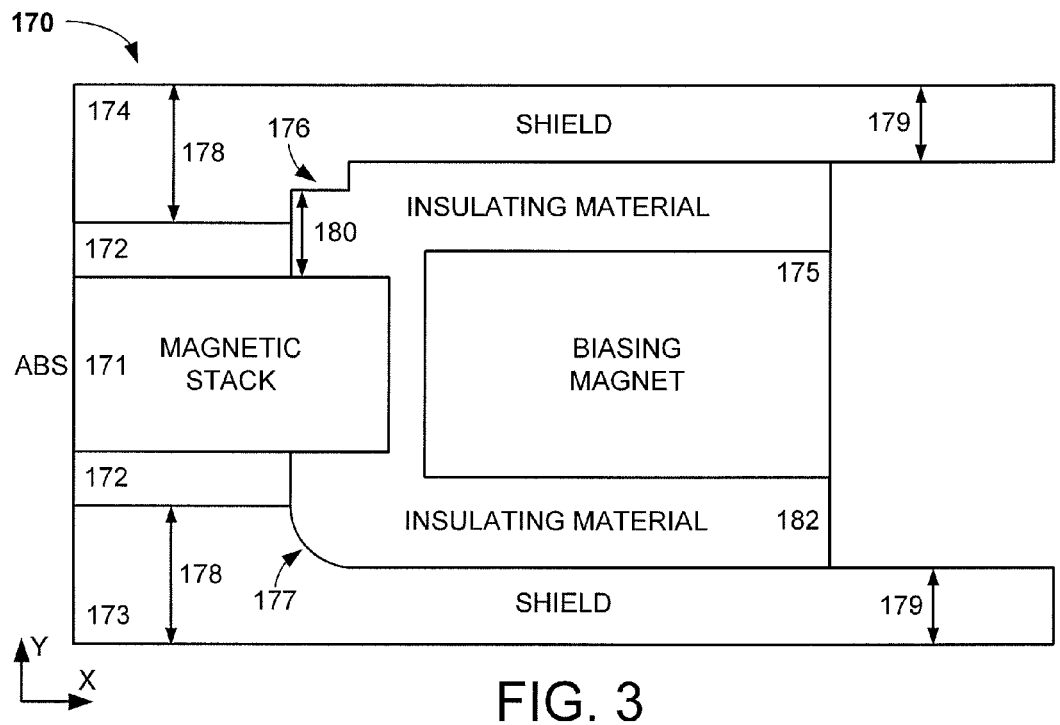
FIG. 3 displays a cross-section block representation of an example magnetic element.

FIG. 3 displays a cross-section block representation of another example magnetic element 170 that can be used to read and write data. The magnetic element 170 has a magnetically responsive stack 171 disposed between top and bottom electrodes 172 and first and second shields 173 and 174. The magnetic stack 171 is positioned on an ABS with a biasing magnet 175 laterally adjacent and separated from the stack 171, distal the ABS.

Each shield 173 and 174 is configured with different transition region configurations 176 and 177 that illustrate the unlimited manner in which shield thickness can vary from an ABS thickness 178 to a biasing thickness 179. The top shield 174 has a stepped transition region configuration 176 that provides an initial shield thickness reduction 180 before plateauing to the biasing thickness 179. Meanwhile, the bottom shield 173 has a continuously curvilinear transition region configuration 177 that can provide a more abrupt arrival at the biasing thickness 179.

The various transition region configurations demonstrated by the beveled region of FIG. 2 and the stepped and curvilinear regions of FIG. 3 illustrate how the transition region can be tuned to accommodate a variety of structural and operational conditions, but such an ability to create tuned shield thicknesses further stresses the ability to fabricate the shields accurately.

In some embodiments, insulating material 182 is used to magnetically isolate the shields 173 and 174 while providing a substrate onto which at least the top shield 174 can be formed. However, aligning the transition regions 176 and 177 of the shields 173 and 174 can be particularly challenging to accomplish efficiently with a single insulating layer 182 due to the intricate tolerances of the transition regions and the process variation encountered with most deposition techniques.

Figure 4:
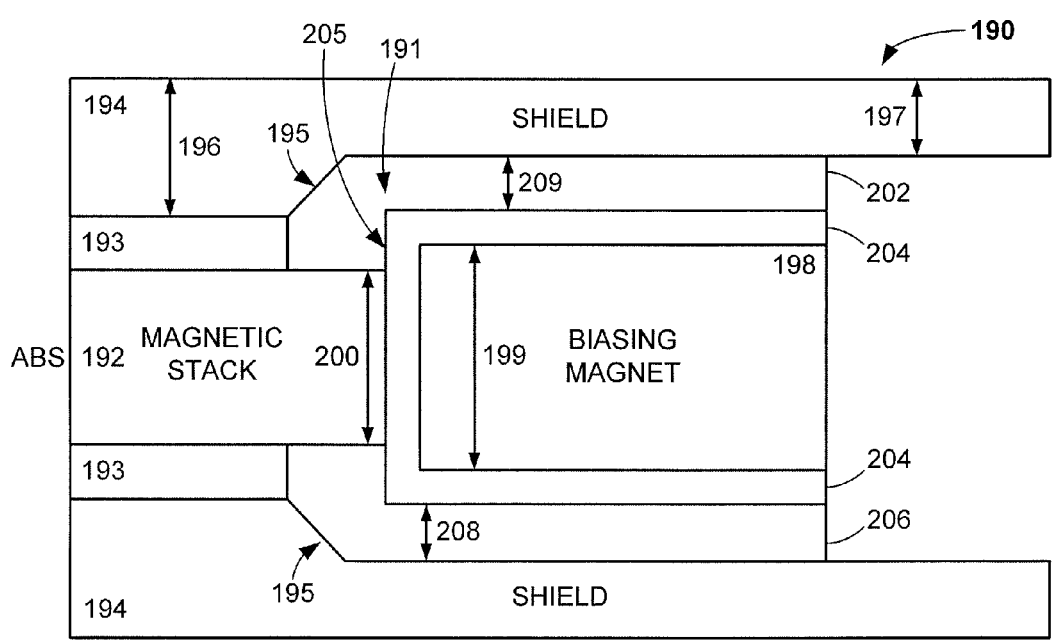
FIG. 4 provides a cross-section block representation of an example magnetic element constructed in accordance with various embodiments.

FIG. 4 generally shows a cross-section block representation of an example magnetic element 190 constructed in accordance with various embodiments to provide a self-aligned insulating feature 191 capable of increasing the efficiency of element fabrication. It is reiterated that while a magnetically responsive stack 192 is shown disposed between electrodes 193 and shields 194, such configuration is not required or limiting as the stack 192 may be a magnetoresistive data writer, the electrodes may be altered, and one or more shields may be omitted.

Each shield 194 has a beveled transition region 195 that takes the shield from an ABS thickness 196 to a reduced biasing thickness 197 to allow for the biasing magnet 198 to have a thickness 199 that is greater than the stack thickness 200. The area separating the biasing magnet 198 from both the shields 194 and magnetic stack 192 is filled with first and second insulating layers 202 and 204 that can be constructed of similar or dissimilar electrically and magnetically non-conductive materials, such as alumina and $SiO_2$, which comprises the self-aligned insulating feature 191 at least between the top shield 194 and the biasing magnet 198. Various embodiments construct the self-aligned insulating feature 191 to provide alignment along a plane parallel to the ABS between the transition regions 195 of the magnetic shields 194 on opposite sides of the magnetic stack 192.

Alignment of the first and second insulating layers 202 and 204 can be defined by the formation of a seam 205 extending along a plane parallel with the ABS and extending from the rear surface of the magnetic stack 192, distal the ABS. The seam 205 can allow the first insulating layer 202 to have a reference plane in which the transition region 195 can be formed in alignment of with the transition region of the shield opposite the magnetic stack 192 within a predetermined tolerance, such as less than or equal to 10 Å. That is, the seam 205 and first and second insulating layers 202 and 204 can be configured to position the transition regions of the respective shields 194 in alignment along a plane parallel to the ABS within the predetermined tolerance.

While multiple insulating features can be present in various embodiments of a magnetic element 190, the construction of an element from the bottom up makes fabrication of the transition region 195 of the top shield 194 more challenging due to the alignment of the top transition region 195 with the existing bottom transition region 195 despite the numerous intervening layers and materials of the magnetic stack 192, electrodes 193, and biasing magnet 198. Hence, the self-aligned insulating feature 182 dramatically simplifies top shield fabrication while increasing the accuracy of the top transition region 195 placement and shape due to the presence of two separately deposited and processed insulating layers 202 and 204.

Starting from the bottom shield 194, a third insulating layer 206 is deposited with a predetermined thickness 208 that extends from the magnetic stack 192 across the bottom transition region 195 and along the bottom shield 194. The second insulating layer 204 is subsequently deposited on the third insulating layer 206 and forms the separating barrier between the biasing magnet 198 and the magnetic stack 192. The second insulating layer 204 can be tuned for thickness to position the biasing magnet 198 far enough away from the magnetic stack 192 to prevent shunting, but allow the influence of a default magnetization.

The second insulating layer 204 can continuously or discontinuously wrap about the biasing magnet 198 to provide an initial insulating feature layer that extends up to, but not past, the rear edge of the magnetic stack 192, distal the ABS along the X axis. The formation of the second insulating layer 204 so as not to extend beyond the rear edge of the magnetic stack 192 allows for the first insulating layer 202 to be self-aligned in the fact that the deposited material of the first insulating layer 202 will fill the space immediately below the top transition region 195 with a predetermined thickness 209 that can be efficiently processed to produce the beveled transition region 195 shown in FIG. 4.

It should be noted that the insulating feature 191 displayed in FIG. 4 is not limiting and is modified in various embodiments. One such embodiment forms the first insulating layer 202 solely between the magnetic stack 192 and top transition region 195 with the second insulating layer 204 left to contact both the biasing magnet 198 and top shield 194. Other embodiments form a stepped or curvilinear transition region with a combination of the first and second insulating layers 202 and 204 each contacting the top shield 194.

Figure 5A:
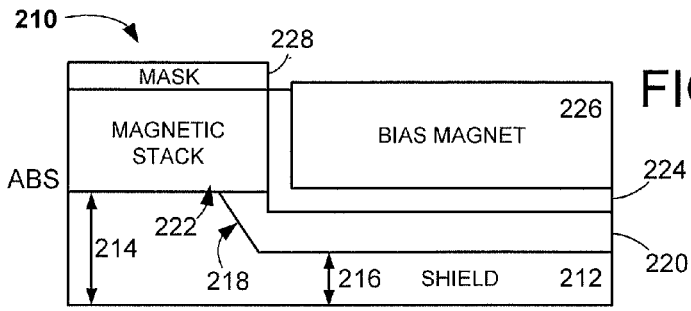
FIGS. 5A-5D display example magnetic element configurations in accordance with various embodiments of the present invention.
Figure 5B:
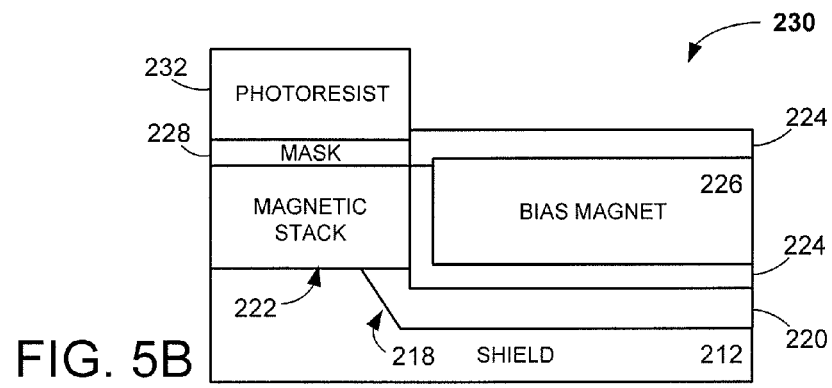

FIGS. 5A through 5D generally illustrate how an example magnetic element can be constructed with a self-aligned insulating feature in accordance with various embodiments. FIG. 5A displays a partially constructed element 210 that has a bottom shield 212 formed with an ABS thickness 214 and a reduced biasing thickness 216 connected by a bottom transition region 218. A third insulating layer 220 is deposited atop the bottom shield 212 and extends to cover the bottom transition region 218 and contact the magnetic stack 222. In the embodiment displayed, the third insulating layer is processed, such as via etching and milling, to provide a level surface below the magnetic stack 222.

Subsequently, a second insulating layer 224 is deposited on the level surface of the third insulating layer 220 to continuously contact the rear surface, distal to the ABS, of the magnetic stack 222. The thickness of the second insulating layer 224 is processed along the rear magnetic stack surface so that a bias magnet 226 is positioned to be physically and electrically separated from the magnetic stack 222, but close enough to impart a default magnetization, especially when the magnetic stack is configured as a trilayer magnetic reader characterized by no pinned magnetizations and dual magnetically free layers.

At any time after the formation of the magnetic stack 222, a masking layer 228, such as a back anti-reflecting coating (BARC), can be deposited to extend the rear surface of the magnetic stack 222 and protect the stack from subsequent deposition and processing. Turning to the partially constructed magnetic element 230 of FIG. 5B, a photoresist layer 232 is deposited on the masking layer 228 with a thickness that extends the rear surface of the magnetic stack 222 and allows for the second insulating layer 224 to be formed atop the bias magnet 226 and extend to meet the initially deposited second insulating layer 224.

Figure 5C:
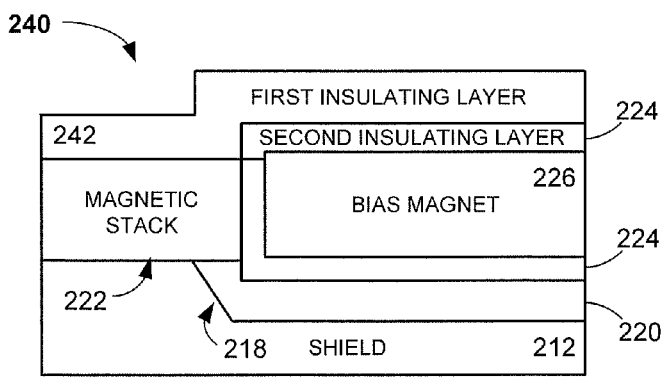

With the second insulating layer 224 providing an electrical and physical barrier between the magnetic stack 222 and the bias magnet 226, the partially completed magnetic element 240 of FIG. 5C displays how the photoresist and masking layers 232 and 228 can be removed to reveal that the second insulating layer 224 extends no farther than the rear surface of the magnetic stack 222.

The removed photoresist and masking layers 232 and 228 provide access to the top surface of the magnetic stack 222, which is covered, along with the second insulating layer 224, with a continuous first insulating layer 242. The deposition of the first insulating layer 242 can occur in a variety of non-limiting manners, such as atomic layer deposition and oblique sputtering, to provide complete coverage of the sidewall presented by the second insulating layer 224 at the rear surface of the magnetic stack 222.

Figure 5D:
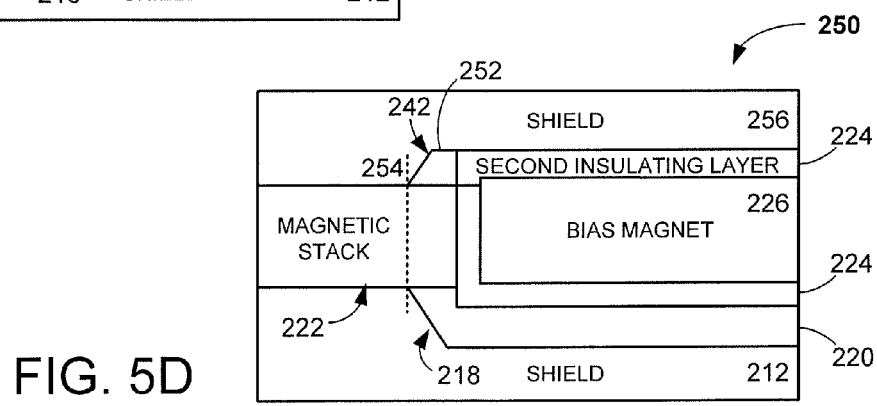

FIG. 5D shows a completed magnetic element 250 subsequent to the processing of the first insulating layer to define the top transition region, which corresponds with the development of the self-aligned insulating feature 252. That is, the first insulating feature 252 can be "self-aligned" due to the bias magnet 226 being present and providing an underlying substrate that positions the first insulating layer 242 in alignment with the bottom transition region. Such alignment allows the top transition region to be aligned with the bottom transition region 218 at least along axis 254 while being laterally aligned with the bias magnet 226 due to the protrusion of the bias magnet 226 above the magnetic stack 222. Hence, the self-alignment of the first insulating layer can be seen from the configuration of the first and second insulating layers that can efficiently be formed with removal, such as with plasma etching, of the insulating layer shown in FIG. 5C to provide the top transition region.

The formation of the top transition region that is aligned with the bottom transition region 218 then allows the top shield 256 to be formed on the magnetic stack 222, insulating feature 252, and second insulating layer 224. It should be noted that the configurations of the first and second insulating layers of FIGS. 3 and 5D differ in how much of the first insulating layer is positioned between the second insulating layer and the top shield. Such difference merely illustrates example embodiment that are in no way limiting to the structure or operation of the self-aligned insulating feature.

Figure 6:
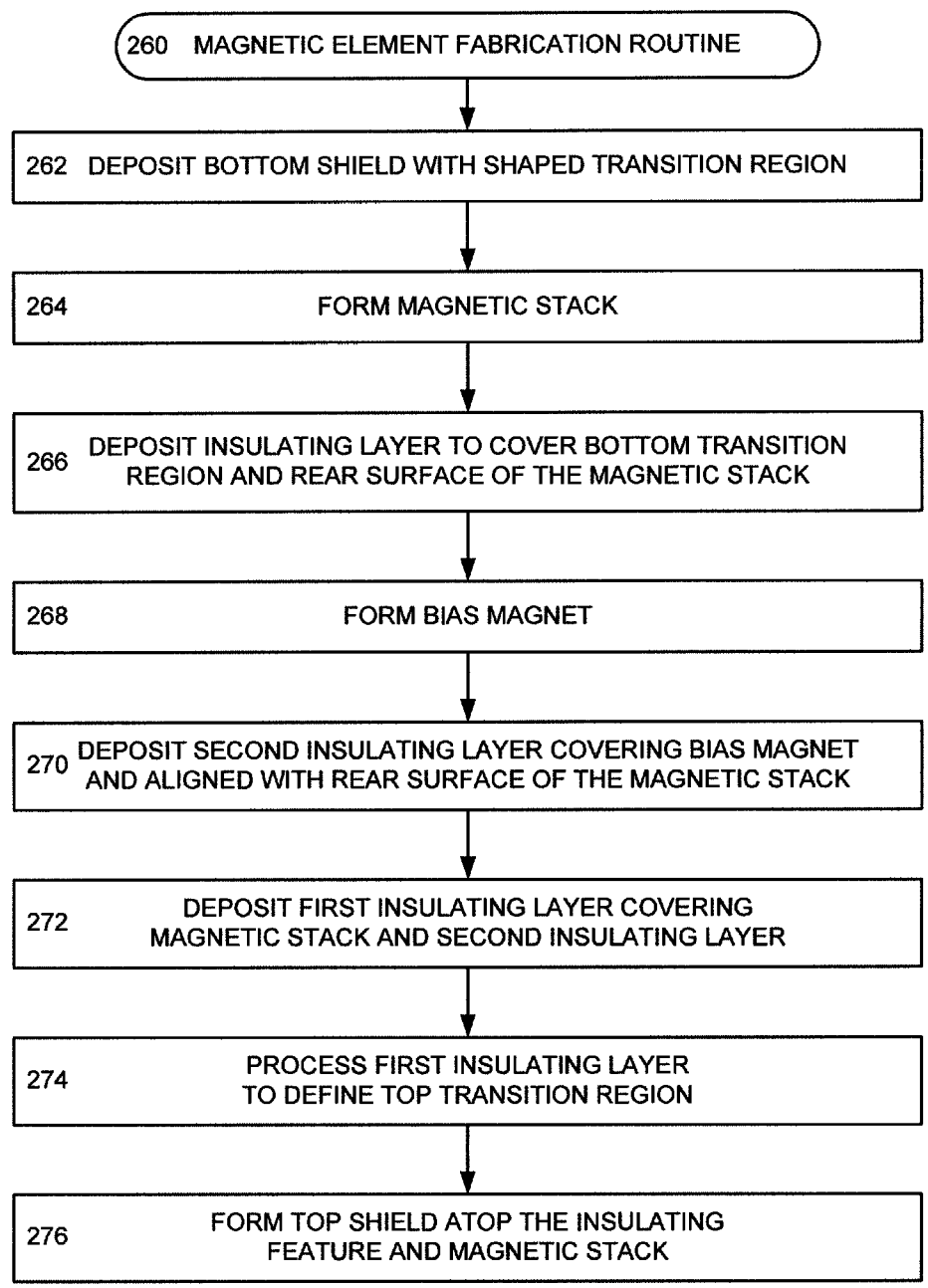
FIG. 6 provides a flowchart of a magnetic element fabrication routine carried out in accordance with various embodiments of the present invention.

FIG. 6 provides an example flowchart of a magnetic element fabrication routine 260 conducted in accordance with various embodiments. Initially, the routine 260 deposits a bottom shield with a shaped transition region on a substrate in step 262. The shield can be constructed on any number of magnetically soft materials, such as NiFe, and have any shape and size of transition region that defines a large and reduced shield thickness in step 262, but no particular shield configuration is required or limiting.

Step 264 then forms the magnetic stack onto the increased thickness portion of the bottom shield. The magnetic stack can be configured to be a lamination of layers that operate to read and write data to an adjacent data storage media. As discussed above, some embodiments construct the magnetic stack as a data reader with a trilayer configuration that has no fixed magnetization and dual magnetically free layers. Next, step 266 deposits one or more insulating layers atop the bottom shield to cover the bottom transition region and the rear surface of the magnetic stack.

The formation of a bias magnet on the insulating layer(s) then comes in step 268, with a second insulating layer covering the bias magnet and extending to the rear surface of the magnetic stack next occurring at step 270. The deposition of a first insulating layer to continuously extend along the magnetic stack and second insulating layer happens in step 272. At this point, the deposited first insulation layer is self-aligned by extending from the rear surface of the magnetic stack that is established by the second insulating layer.

Step 274 processes the first insulating layer to define the top transition region, which can be an unlimited number of shapes and sizes, while ensuring alignment with the bottom transition region due to the establishment of the rear surface of the magnetic stack by the second insulation layer. The formation of the top transition region in step 274 also constructs the self-aligned insulating feature comprised of the first and second insulating layers.

To finish the magnetic element and routine 260, step 276 forms the top shield atop the insulating feature and magnetic stack. With routine 260, it can be appreciated that a magnetic element can be constructed with different material and structural configurations. The routine 260 is not limited only to the steps and decisions provided in FIG. 6 as any number of steps and determinations can be added, omitted, and modified to accommodate the fabrication of a precisely tuned magnetic element. For example, the deposition and subsequent removal of masking and photoresist layers can be added to the routine 260.

Further of note is that no particular deposition and formation processes are required to deposit the various layers in the routine 260. That is, atomic layer deposition can be used for some layers while vapor layer deposition can be utilized for other layers. Such an ability to use various formation processes can allow further ability to tune magnetic sensor fabrication with improved manufacturing efficiency and reliability.

It can be appreciated that the configuration and material characteristics of the magnetic element with a self-aligned insulating feature allows for accurate and efficient construction with aligned top and bottom transition regions. The use of varying shield thicknesses and tuned transition regions that are vertically aligned parallel to the ABS can provide precise spacing within the magnetic sensor and increased magnetic stability. In addition, while the embodiments have been directed to magnetic sensing, it will be appreciated that the claimed invention can readily be utilized in any number of other applications, such as magnetic writing and solid state magnetic shielding.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present technology.

What is claimed is:

1. An apparatus comprising a magnetic stack extending from an air bearing surface (ABS) to a rear surface, the magnetic stack separated from a magnetic shield by a self-aligned insulating feature separated from the ABS, contacting a top surface of the magnetic stack, and positioned between the rear surface of the magnetic stack and the ABS, the self-aligned insulating feature comprising of a first insulating material extending no farther from the ABS than the rear surface of the magnetic stack, a second insulating material contacting the first insulating material and extending around a rear bias magnet and into a reduced thickness portion of the magnetic shield to separate the magnetic shield and magnetic stack from the bias magnet.

2. The apparatus of claim 1, wherein the self-aligned insulating feature defines a top transition region of a first shield adjacent the magnetic stack.

3. The apparatus of claim 1, wherein the self-aligned insulating feature is aligned along a plane parallel with the ABS and with a bottom transition region of a second shield adjacent the magnetic stack.

4. The apparatus of claim 1, wherein the first insulating material is shaped to fill a first transition region.

5. The apparatus of claim 1, wherein the second insulating material is aligned with the rear surface of the magnetic stack, distal the ABS.

6. The apparatus of claim 1, wherein the second insulating material contacts the bias magnet and the magnetic stack.

7. A sensor comprising:
   a magnetic stack disposed between first and second shields on an air bearing surface (ABS), the magnetic stack extending from the ABS to a rear surface, the first and second shields comprising first and second transition regions separated from the ABS and positioned between the rear surface of the magnetic stack and the ABS, respectively; and
   means for aligning the first and second transition regions along a plane parallel to the ABS and between the ABS and the rear surface of the magnetic stack, the means for aligning comprising first and second insulating materials that contact and occupy the first transition region in a reduced thickness portion of the first shield.

8. The sensor of claim 7, wherein the means for aligning comprises a seam between the first and second insulating materials, the seam aligned with the rear surface of the magnetic stack, distal and parallel to the ABS.

9. A data reader comprising:
   a magnetic stack disposed between first and second shields on an air bearing surface (ABS), the magnetic stack having top and bottom surfaces extending from the ABS to a rear surface distal the ABS, each shield comprising a transition region separated from the ABS and positioned between the rear surface of the magnetic stack and the ABS and aligned along a first plane parallel to the ABS, a first transition region of the first shield comprising a first insulating material contacting the top surface of the magnetic stack and extending no farther from the ABS than the rear surface of the magnetic stack, a second transition region of the second shield comprising a second insulating material contacting the bottom surface of the magnetic stack and extending beyond the rear surface of the magnetic stack, a third insulating material extending around a biasing magnet to contact the first insulating material and separate the magnetic stack, first shield, and second shield from the biasing magnet.

10. The data reader of claim 9, wherein the first insulating material comprises a dissimilar material than the third insulating material.

11. The data reader of claim 9, wherein at least one insulating material is a non-magnetic material.

12. The data reader of claim 9, wherein at least one insulating material is alumina.

13. The data reader of claim 9, wherein each insulating material is electrically and magnetically non-conductive.

14. The data reader of claim 9, wherein the magnetic stack is a trilayer sensor having a plurality of magnetically free layers biased to a predetermined magnetization by the biasing magnet disposed between the first and second shields, distal the ABS.

15. The data reader of claim 9, wherein each insulating material is separated by a seam.

16. The data reader of claim 9, wherein each insulating material is alumina.

17. The data reader of claim 9, wherein the transition regions of the first and second shields are aligned within a predetermined tolerance range.

18. The data reader of claim 9, wherein the predetermined tolerance range is less than or equal to 10 Å.

* * * * *